United States Patent
Lukanc et al.

(10) Patent No.: US 8,975,195 B2
(45) Date of Patent: Mar. 10, 2015

(54) METHODS FOR OPTICAL PROXIMITY CORRECTION IN THE DESIGN AND FABRICATION OF INTEGRATED CIRCUITS

(71) Applicant: GLOBALFOUNDRIES, Inc., Grand Cayman, KY (US)

(72) Inventors: Todd Lukanc, San Jose, CA (US); Christopher Heinz Clifford, San Francisco, CA (US); Tamer Coskun, San Jose, CA (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 220 days.

(21) Appl. No.: 13/757,286

(22) Filed: Feb. 1, 2013

(65) Prior Publication Data
US 2014/0220786 A1    Aug. 7, 2014

(51) Int. Cl.
*H01L 21/31* (2006.01)
*H01L 21/3105* (2006.01)
*H01L 21/312* (2006.01)
*G06F 17/50* (2006.01)
*H01L 21/02* (2006.01)

(52) U.S. Cl.
CPC .......... *G06F 17/50* (2013.01); *H01L 21/02348* (2013.01); *Y10S 438/942* (2013.01); *Y10S 438/948* (2013.01)
USPC ............. 438/780; 438/942; 438/948; 716/53; 716/54; 716/55; 430/5

(58) Field of Classification Search
CPC .......................... H01L 21/02348; G06F 17/50
USPC ................ 438/780, 942, 948; 716/53, 54, 55; 430/5; 382/144
See application file for complete search history.

(56) References Cited

U.S. PATENT DOCUMENTS

| | | | |
|---|---|---|---|
| 5,553,274 A * | 9/1996 | Liebmann | 716/53 |
| 6,114,071 A * | 9/2000 | Chen et al. | 430/5 |
| 6,415,421 B2 * | 7/2002 | Anderson et al. | 716/52 |
| 6,433,457 B1 * | 8/2002 | Nakamura | 310/263 |
| 6,569,575 B1 * | 5/2003 | Biebuyck et al. | 430/5 |
| 6,828,068 B2 * | 12/2004 | Progler et al. | 430/5 |

(Continued)

FOREIGN PATENT DOCUMENTS

WO    WO 2005/045897    *    5/2005

OTHER PUBLICATIONS

Mack et al., Mask bias in submicron optical lithography, Journal of Vacuum Science & Technology B, vol. 6, No. 6, Nov./Dec. 1988, pp. 2213-2220.*

*Primary Examiner* — Mary Wilczewski
(74) *Attorney, Agent, or Firm* — Ingrassia Fisher & Lorenz, P.C.

(57) ABSTRACT

A method of manufacturing an optical lithography mask includes providing a patterned layout design comprising a plurality of polygons, correcting the patterned layout design using optical proximity correction (OPC) by adjusting widths and lengths of one or more of the plurality of polygons, to generate a corrected patterned layout design, converting the corrected patterned layout design into a mask writer-compatible format, to generate a mask writer-compatible layout design comprising the plurality of polygons, and biasing each polygon in the plurality of polygons with a bias that accounts for large-scale density values of the patterned layout design, to generate a biased, mask writer-compatible layout design.

20 Claims, 3 Drawing Sheets

(56) References Cited

U.S. PATENT DOCUMENTS

| | | | |
|---|---|---|---|
| 7,010,764 B2 * | 3/2006 | Pierrat | 716/53 |
| 7,017,141 B2 * | 3/2006 | Anderson et al. | 716/52 |
| 7,055,127 B2 * | 5/2006 | Pierrat et al. | 716/53 |
| 7,069,533 B2 * | 6/2006 | Kochpatcharin et al. | 716/53 |
| 7,234,130 B2 * | 6/2007 | Word et al. | 716/55 |
| 7,369,291 B2 * | 5/2008 | Karlin | 359/239 |
| 7,412,676 B2 * | 8/2008 | Cobb et al. | 716/106 |
| 7,444,615 B2 * | 10/2008 | Percin et al. | 716/52 |
| 7,458,056 B2 * | 11/2008 | Pierrat | 716/53 |
| 7,473,500 B2 * | 1/2009 | Progler et al. | 430/5 |
| 7,552,416 B2 * | 6/2009 | Granik et al. | 716/50 |
| 7,614,033 B2 * | 11/2009 | Pierrat et al. | 716/50 |
| 7,694,268 B2 * | 4/2010 | Dick | 716/53 |
| 7,945,871 B2 * | 5/2011 | Cobb et al. | 716/52 |
| 7,987,434 B2 * | 7/2011 | Granik et al. | 716/50 |
| 8,037,429 B2 * | 10/2011 | Shang et al. | 716/53 |
| 8,434,031 B2 * | 4/2013 | Granik | 716/54 |
| 8,739,080 B1 * | 5/2014 | Tsai et al. | 716/54 |
| 8,745,550 B2 * | 6/2014 | Cheng et al. | 716/53 |
| 8,799,830 B2 * | 8/2014 | Robles | 716/51 |
| 8,839,157 B2 * | 9/2014 | Tsai et al. | 716/50 |
| 2003/0138706 A1 * | 7/2003 | Progler et al. | 430/5 |
| 2005/0233228 A1 * | 10/2005 | Fijol et al. | 430/50 |
| 2005/0270615 A1 * | 12/2005 | Karlin | 359/239 |
| 2007/0009816 A1 * | 1/2007 | Pforr et al. | 430/30 |
| 2007/0032896 A1 * | 2/2007 | Ye et al. | 700/108 |
| 2010/0208978 A1 * | 8/2010 | Terasawa et al. | 382/145 |
| 2013/0071776 A1 * | 3/2013 | Sahouria et al. | 430/5 |
| 2013/0185681 A1 * | 7/2013 | Liu et al. | 716/51 |
| 2014/0220786 A1 * | 8/2014 | Lukanc et al. | 438/758 |

\* cited by examiner

METHODS FOR OPTICAL PROXIMITY CORRECTION IN THE DESIGN AND FABRICATION OF INTEGRATED CIRCUITS

TECHNICAL FIELD

Embodiments of the present disclosure are generally directed to methods for designing and fabricating integrated circuits. More particularly, embodiments of the present disclosure are directed to methods for optical proximity correction (OPC) in the design and fabrication of integrated circuits.

BACKGROUND

Generally, integrated circuits and other semiconductor devices are used in a variety of electronic applications, such as computers, cellular phones, personal computing devices, and many other applications. Home, industrial, and automotive devices, which in the past included only mechanical components, now have electronic parts that require semiconductor devices.

Semiconductor devices are manufactured by depositing many different types of material layers over a semiconductor workpiece or wafer, and patterning the various material layers using lithography. The material layers typically include thin films of conductive, semiconductive, and insulating materials that are patterned and etched to form integrated circuits (IC's). There may be a plurality of transistors, memory devices, switches, conductive lines, diodes, capacitors, logic circuits, and other electronic components formed on a single die or chip.

Lithography involves the transfer of an image of a mask to a material layer of a die or chip, also referred to as a wafer. The image is formed in a layer of photoresist, the photoresist is developed, and the photoresist is used as a mask during a process to alter the material layer, such as etching and patterning the material layer.

As feature sizes of semiconductor devices continue to decrease, as is the trend in the semiconductor industry, transferring patterns from a lithography mask to a material layer of a semiconductor device becomes more difficult, due to the effects of the light or energy used to expose the photoresist. A phenomenon referred to as the "proximity effect" results in the line width of patterns varying, depending the proximity of a feature to other features. Closely-spaced features tend to be smaller than widely-spaced features, although on a lithography mask they include the same dimensions. It is important in many semiconductor device designs for features to have uniform, predictable dimensions across a surface of a wafer to achieve the required device performance.

To compensate for the proximity effect, optical proximity corrections (OPC) are often made to lithography masks, which may involve adjusting the widths or lengths of the lines on the mask. More advanced methods of OPC correct corner rounding and a general loss of fidelity in the shape of features by adding small secondary patterns referred to as serifs to the corners of patterns. The serifs, together with line width changes, enhance the amount of light transmitted through the transparent mask patterns.

The OPC design phase is time-consuming, and therefore costly. Often, it is desirable to introduce a product as quickly as possible to the market in the semiconductor device industry. However, it may take up to two or three weeks for OPC calculations to be performed on a semiconductor device design.

As such, it is desirable to provide faster and more efficient methods of calculating and determining OPC for lithography masks used to fabricate semiconductor devices. Furthermore, other desirable features and characteristics of the inventive subject matter will become apparent from the subsequent detailed description of the inventive subject matter and the appended claims, taken in conjunction with the accompanying drawings and this background of the inventive subject matter.

BRIEF SUMMARY

Methods for optical proximity correction in the design of integrated circuits are disclosed. In an exemplary embodiment, a method of manufacturing an optical lithography mask includes designing an optical photomask for forming a pre-pattern opening in a photoresist layer on a semiconductor substrate. The step of designing the optical photomask includes providing a patterned layout design comprising a plurality of polygons that correspond with the pre-pattern opening, correcting the patterned layout design using optical proximity correction by adjusting widths and lengths of one or more of the plurality of polygons, to generate a corrected patterned layout design, converting the corrected patterned layout design into a mask writer-compatible format, to generate a mask writer-compatible layout design comprising the plurality of polygons, and biasing each polygon in the plurality of polygons with a bias that accounts for large-scale density values of the patterned layout design, to generate a biased, mask writer-compatible layout design. In an alternative embodiment, biasing may be provided by altering the light during mask write of the plurality of polygons. The method further includes manufacturing the optical photomask in a mask writer tool using the biased, mask writer-compatible layout design as a template for the optical photomask.

In accordance with another exemplary embodiment, a method for fabricating an integrated circuit includes providing semiconductor substrate comprising a silicon material, forming a photoresist layer over the semiconductor substrate, and providing an optical photomask mask. Providing the optical lithography mask includes the step of designing the optical photomask for forming a pre-pattern opening in the photoresist layer on the semiconductor substrate. The step of designing the optical photomask includes providing a patterned layout design comprising a plurality of polygons that correspond with the pre-pattern opening, correcting the patterned layout design using optical proximity correction by adjusting widths and lengths of one or more of the plurality of polygons, to generate a corrected patterned layout design, converting the corrected patterned layout design into a mask writer-compatible format, to generate a mask writer-compatible layout design comprising the plurality of polygons, and biasing each polygon in the plurality of polygons with a bias that accounts for large-scale density values of the patterned layout design, to generate a biased, mask writer-compatible layout design. Providing the optical lithography mask further includes the step of manufacturing the optical photomask in a mask writer tool using the biased, mask writer-compatible layout design as a template for the optical photomask. In an alternative embodiment, biasing may be provided by altering the light during mask write of the plurality of polygons. The method further comprises disposing the optical photomask over the photoresist layer and directing a light source through the photomask so as to expose a portion of the photoresist layer to the light source.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
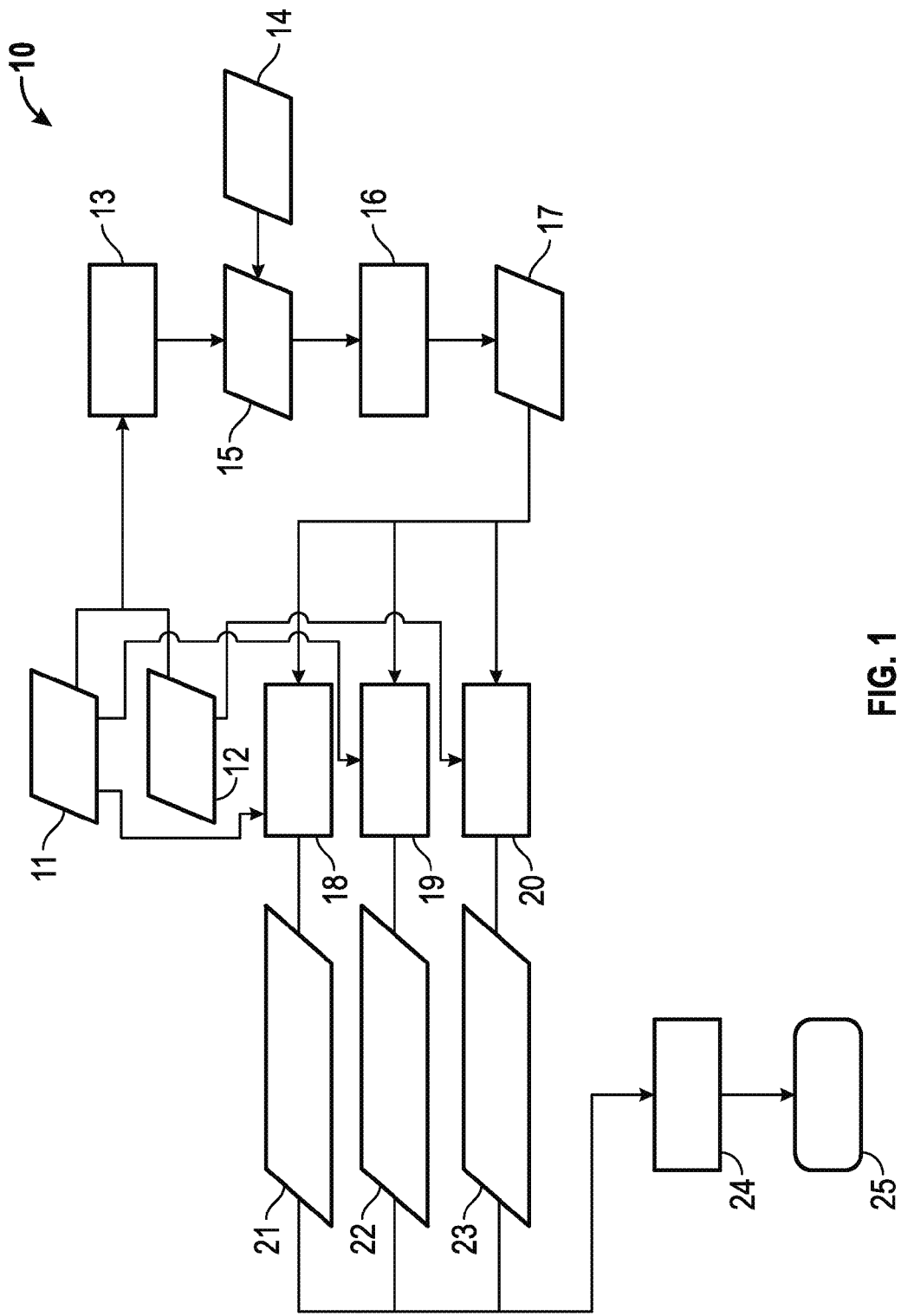
FIG. 1 is a block diagram of a process for optical proximity correction known in the art.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Embodiments of the present disclosure provide methods for designing an optical photomask. Optical photomasks may be employed in the manufacture of integrated circuits in the following manner as well-known in the art: Electromagnetic radiation is directed through the optical photo mask and onto a photoresist layer that has been deposited on a semiconductor substrate. The electromagnetic radiation, when contacting the photoresist layer, forms a pre-pattern opening in the photoresist layer. The pre-pattern opening allows for the deposition and/or etching of a plurality of materials onto the semiconductor substrate to form one or more semiconductive transistor structures thereon.

Although the subject matter is described herein in the context of a complementary metal oxide semiconductor (CMOS) device, the subject matter is not intended to be limited to CMOS semiconductor devices, and may be utilized with other MOS semiconductor devices which are not CMOS semiconductor devices. Additionally, although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. Various steps in the fabrication of MOS semiconductor devices are well known and so, in the interest of brevity, many conventional steps will only be mentioned briefly herein or will be omitted entirely without providing the well-known process details.

Although various types of photolithographic processes are known in the art, state of the art semiconductor fabrication processes commonly use "extreme" ultraviolet (EUV) photolithography to form the pre-pattern openings in the photoresist layer. During semiconductor wafer fabrication, extreme ultraviolet (EUV) light can be utilized in a lithographic process to enable transfer of very small patterns, such as nanometer-scale patterns, from an optical mask to a semiconductor wafer. In EUV lithography, a pattern formed on an EUV lithographic mask (also referred to as an EUV "reticle" in the present application) can be transferred to a semiconductor wafer by reflecting EUV light off of portions of a reflective surface. However, due to the high energy of the EUV light, unwanted rays of light can reach areas of the photoresist layer, thereby altering the pattern to be transferred by the mask. As such, one patterning issue that is commonly known in the art and associated with EUV photolithography is the scatter of light as a function of density and change in density of light across a large distance.

As is currently known in the art, OPC methods are applied to a desired semiconductor design to allow the proper pattern to be realized on the silicon wafer using EUV photolithography. Semiconductor designs typically include a plurality of shapes to be drawn (and transferred to the wafer), for example a plurality of polygons. OPC methods computationally simulate the polygons and update the shape of each of the polygons with respect to how neighboring polygons will interact with such polygon, when the pattern is transferred to the wafer using EUV photolithography. This process is very computationally intensive with respect to the local proximity of the polygons, which in some instances can be as small as a few microns.

To reduce this runtime and computational expense, many OPC software tools currently employed in the art rely on algorithms that attempt to find "similar" patterns on small scales (i.e., patterns of similar polygons that are located in similar proximity to one another) to allow replication of the solution wherever possible, without having to rerun the computation for each instance of the pattern. As noted above, it has been found in practice that although EUV processes employ shorter wavelength light, the same level of OPC and data manipulation has been shown to be needed when using EUV wavelength light source technologies as has been employed with other types of light sources using the current OPC software.

In particular, current EUV photolithographic processes typically suffer from a small but measurable amount of scattered light "showering" the regions on the wafer that neighbor the transferred pattern. This phenomenon is also referred to in the art as "EUV flare" or simply "flare." This added light is a function of both the density (of polygon shapes drawn) of the area exposed to the EUV light, as well as the change in density across the wafer. This flare effect undesirably alters the final, transferred polygon size from desired (design) values. As such, the designs need to be to be corrected for the flare effect in order to obtain optimal wafer patterns. EUV flare can scatter light several microns, even millimeters away from the exposed area. Compensation for the flare is commonly achieved by "biasing" the design to counter the global size change associated with the increase in baseline light from flare.

The computation for flare correction is very expensive with the current OPC software tools, as calculations over a large area surrounding the target (exposed) area need to be taken into account. Current illumination systems (KrF- or ArF-based) have illumination proximities that are in the range of a few microns, and therefore OPC software tools for these systems need only account for a relatively short range from the patterned area. In contrast, an EUV illumination system has flare that is in the range of many microns to even millimeters of proximity. Correcting for this flare significantly by altering individual cells alters the hierarchy of the database thus flattening the date and greatly increases the computation time, often by orders of magnitude. Further, as an added complication, current OPC procedures process each chip (or part of the data going onto a mask) separately, and then combine the data as a last step to write the mask. However, this approach is not suitable for EUV photolithography, as the relatively long-range impact of EUV flare now needs to be calculated across all the data going into a mask, thus all data should be processed at the same time. Most high-powered computing system (also referred to as computing "farms") are not large enough to process this level of data at the same time while running the intensive calculations needed for complex OPC.

Given the fact that OPC for EUV flare correction, as noted above, is a relatively straight-forward biasing correction, and is based on global densities of the wafer, embodiments of the present disclosure are directed to systems and processes wherein the OPC flare compensation calculations can be applied at a second, later step of data manipulation and correction. In one embodiment, the second, later step of wafer design processing where the OPC calculation may be implemented is during conversion of the final design database of polygon shapes into mask writer format (the mask writer is the apparatus/tool that prepares the optical mask) by translating and optimizing the drawn layout into mask writer-compatible/optimized polygons (a process known in the art as mask writer "fracturing"). In the current art, the "fracturing" compensation is applied to OPC-corrected design to counter electron beam (or other) mask writer variations, or mask etch and overall module variations due to local or global densities. The software used at this second correction step is typically optimized to handle a simplified form of data such that long range density calculations or adjustments based on long range corrections are not as time or computationally expensive.

In an embodiment of the present disclosure, the corrections to the layout design at the mask writer, i.e., the conversion of the drawn layout design to the mask writer format with associated compensations as noted above, may be reconfigured to further take into account flare biasing corrections, such as the large scale density values and variations noted above, and then add a "final" bias (i.e., a single correction that takes into account both mask writer corrections and EUV flare corrections) to all polygons based on this density equation. Further, as an extension of the presently described embodiment, the density of all data in the optical mask can be used, in combination with information relating to how the next sequential pattern's flare will impact the current pattern (e.g., how right edge of the next sequential pattern will impact the left edge of the current pattern being exposed on the wafer), in order to augment the calculation of the flare correction for the next sequential pattern.

Figure 2:
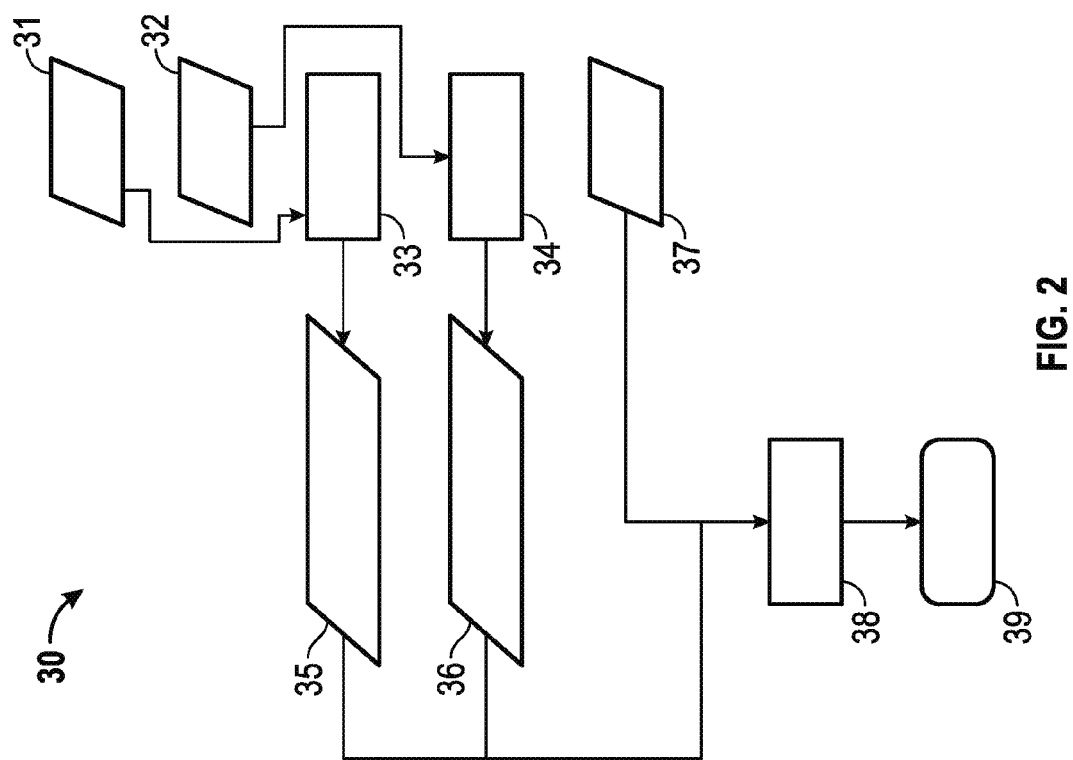
FIG. 2 is a block diagram of an exemplary process for optical proximity correction in accordance with an embodiment of the present disclosure.

Greater detail regarding the inventive subject matter disclosed herein will now be provided with reference to FIGS. 1 and 2. FIG. 1 illustrates a current, state of the art procedure 10 for EUV OPC, and is provided for purposes of comparison with FIG. 2, which illustrates an improved procedure 30 for EUV OPC in accordance with an embodiment of the present disclosure. Referring now particularly to FIG. 1, procedure 10 begins with the provision of one or more chip design layouts 11 for transferring to an optical mask. Further provided is a "Kerf" layout 12, which, as is known in the art, refers to the layout of the area between individual semiconductor chips on the wafer. As such, the design layout(s) 11 and the Kerf layout 12 define the full pattern of the wafer. The layouts 11 and 12 are then assembled in an assembly process 13 to provide an assembled layout 15, which is the overall design of the wafer including the chip patterns and the Kerf area. In order to perform the correction for the flare caused by the EUV light, information 14 is provided regarding the EUV illumination system. This information 14 can include, for example, the biasing parameters for the particular EUV process employed, which are needed to correct for the resulting EUV flare. The information 14, in combination with the assembled layout 15, is used to generate, at process 16, an EUV flare-corrected design 17, which is also referred to as a "flaremap."

OPC is applied to the chip design at processes 18 and 19. Two OPC processes 18 and 19 are shown in this example for a chip that is placed two times on the optical mask, as is conventional in the art. As shown, the OPC processes 18 and 19 take into account the flare-corrected design 17 that was previously generated in process 16. A further OPC process 20 is shown for the flare-corrected Kerf design. Once the processes 18, 19, and 20 are finally complete, post-OPC designs 21, 22, and 23 are produced, respectively. Each such design 21, 22, and 23 are provided to the mask writer correction system wherein the above-noted mask writer corrections (i.e., "fracturing") are applied in a process 24 to produce a final design 25 that is compatible with the mask writer for generating the optical mask.

As noted above, performing OPC on a chip design that incorporates the flare correction is very computationally expensive, and results in significant delays and costs in the iterative design of integrated circuits. As such it is desirable to provide a system that avoids performing OPC on a flare-corrected design, but still allows for flare correction in the final design in order to minimize processing-induced chip defects and variances.

Referring now to FIG. 2, an exemplary process 30 begins in the same manner as process 10, with the provision of a chip(s) design 31 and a Kerf area design 32. In process 30, however, the non-OPC-corrected designs 31, 32 are not assembled for flaremap generation. Rather, the designs 31 and 32 are submitted for OPC without initially accounting for the EUV flare. As shown in FIG. 2, process 33 performs OPC on the chip(s) design 31, and process 34 performs OPC on the Kerf design 32. The result of processes 33 and 34 are a post-OPC chip design 35 and a post-OPC Kerf design 36, both of which have been corrected as noted above for various proximity-induced errors that can occur in the patterning of a wafer.

The post-OPC chip and Kerf designs 35 and 36 are thereafter submitted to the mask writing system for having mask writing corrections applied thereto. As noted above, the software used at this second correction step is typically optimized to handle a simplified form of data such that long range density calculations or adjustments based on long range corrections are not as time or computationally expensive. As EUV flare corrections are also long-range corrections, it becomes possible to integrate the biasing parameters 37 for the flare correction at the stage of applying mask writing corrections. As shown in FIG. 2, both such corrections are applied in a combined correction process 38 that incorporates corrections specific to the mask writer and corrections specific to the EUV flare. The long-range nature of both such corrections makes combination thereof particularly suitable. The combined correction process 38 is computationally more expense than simply performing mask fracturing as in process 10, however, the computational expense saved by not performing OPC on flare corrected chip and Kerf designs more than makes up for this difference, thereby enabling an overall less computationally expensive process 30 in accordance with the present disclosure.

Figure 3:
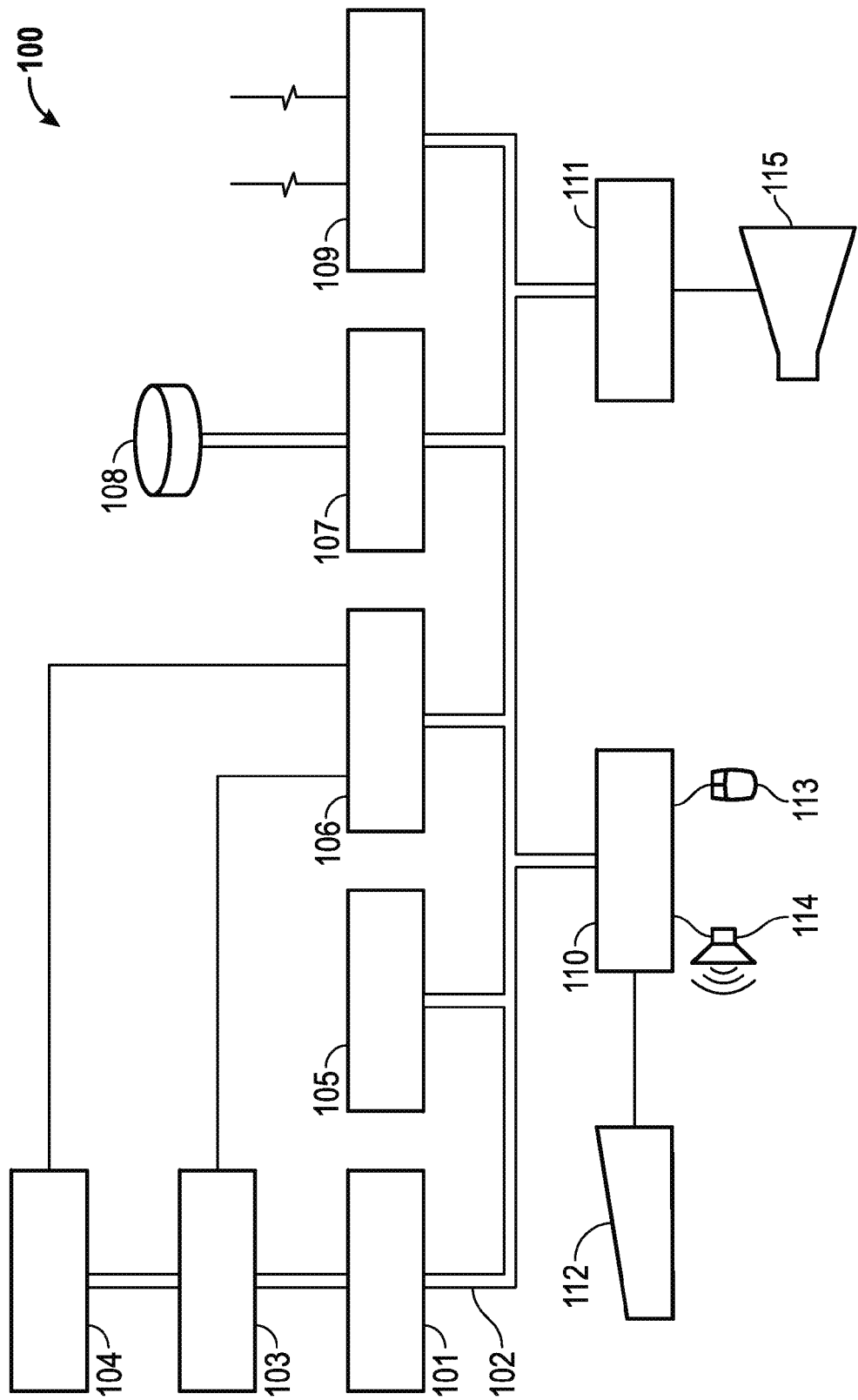
FIG. 3 is a schematic illustration of a block diagram of a computing system arranged in accordance with some examples.

Advantageously, embodiments of the present disclosure can be implemented on one or more computer systems. For example, the OPC computations and the combined flare correction/mask fracturing computations can be performed using one or more computer systems configured in the following manner: FIG. 3 is a schematic illustration of a block diagram of a computing system 100 arranged in accordance with some examples. Computer system 100 is also representative of a hardware environment for the present disclosure. For example, computer system 100 may have a processor 101 coupled to various other components by a system bus 102.

Referring to FIG. 3, an operating system 103 may run on processor 101, and provide control and coordinate the functions of the various components of FIG. 1. An application 104 in accordance with the principles of examples of the present disclosure may execute in conjunction with operating system 103, and provide calls and/or instructions to operating system 103 where the calls/instructions implement the various functions or services to be performed by application 104 (which can be the OPC or mask writer fracturing software).

Referring to FIG. 3, a read-only memory ("ROM") 105 may be coupled to system bus 102, and can include a basic input/output system ("BIOS") that can control certain basic functions of computer device 100. A random access memory ("RAM") 106 and a disk adapter 107 may also be coupled to system bus 102. Such memory components may be used to store, for example, the EUV flare biasing parameters or application 104 software code. It should be noted that software components, including operating system 103 and application 104, may be loaded into RAM 106, which may be computer system's main memory for execution. A disk adapter 107 may be provided which can be an integrated drive electronics ("IDE") or parallel advanced technology attachment ("PATA") adapter, a serial advanced technology attachment ("SATA") adapter, a small computer system interface ("SCSI") adapter, a universal serial bus ("USB") adapter, an IEEE 1394 adaptor, or any other appropriate adapter that communicates with a disk unit 108, e.g., disk drive.

Referring to FIG. 3, computer system 100 may further include a communications adapter 109 coupled to bus 102. Communications adapter 109 may interconnect bus 102 with an external network (not shown) thereby facilitating computer system 100 to communicate with other similar and/or different devices.

Input/Output ("I/O") devices may also be connected to computer system 100 via a user interface adapter 110 and a display adapter 111. For example, a keyboard 112, a mouse 113 and a speaker 114 may be interconnected to bus 102 through user interface adapter 110. Data may be provided to computer system 100 through any of these example devices. A display monitor 115 may be connected to system bus 102 by display adapter 111. In this example manner, a user can provide data or other information to computer system 100 through keyboard 112 and/or mouse 113, and obtain output from computer system 100 via display 115 and/or speaker 114.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of manufacturing an optical lithography mask, the method comprising the steps of:
    designing an optical photomask for forming a pre-pattern opening in a photoresist layer on a semiconductor substrate, wherein the step of designing the optical photomask comprises:
        providing a patterned layout design comprising a plurality of polygons that correspond with the pre-pattern opening;
        correcting the patterned layout design using optical proximity correction (OPC) by adjusting widths and lengths of one or more of the plurality of polygons, to generate a corrected patterned layout design;
        converting the corrected patterned layout design into a mask writer-compatible format, to generate a mask writer-compatible layout design comprising the plurality of polygons; and
        biasing each polygon in the plurality of polygons with a bias that accounts for large-scale density values of the patterned layout design, to generate a biased, mask writer-compatible layout design; and
    manufacturing the optical photomask in a mask writer tool using the biased, mask writer-compatible layout design as a template for the optical photomask.

2. The method of claim 1, wherein providing the patterned layout design comprises providing a computer-generated patterned layout design.

3. The method of claim 1, wherein correcting the pattern layout design using OPC comprises accounting for proximity effect errors.

4. The method of claim 3, wherein accounting for proximity effect errors comprises accounting for errors introduced within a few microns of a respective polygon of the plurality of polygons.

5. The method of claim 1, wherein converting the corrected patterned layout design into a mask writer-compatible format comprises accounting for mask writer electron beam process variations.

6. The method of claim 1, wherein biasing each polygon in the plurality of polygons is performed coterminously with converting the corrected patterned layout design into a mask writer-compatible format.

7. The method of claim 1, wherein the optical photomask is designed to form the pre-pattern opening using extreme ultraviolet (EUV) light.

8. The method of claim 7, wherein biasing each polygon in the plurality of polygons comprises compensating for EUV flare.

9. The method of claim 1, wherein providing the patterned layout design comprises providing at least one chip design and at least one Kerf design.

10. The method of claim 1, wherein correcting the patterned layout design using OPC comprises separately correcting the at least one chip design and the at least one Kerf design.

11. The method of claim 1, wherein biasing each polygon in the plurality of polygons with the bias is performed subsequent to correcting the patterned layout design using OPC.

12. A method for fabricating an integrated circuit, the method comprising:
    providing semiconductor substrate comprising a silicon material;
    forming a photoresist layer over the semiconductor substrate;

providing an optical photomask mask, wherein providing the optical lithography mask comprises the steps of:
designing the optical photomask for forming a pre-pattern opening in the photoresist layer on the semiconductor substrate, wherein the step of designing the optical photomask comprises:
providing a patterned layout design comprising a plurality of polygons that correspond with the pre-pattern opening;
correcting the patterned layout design using optical proximity correction (OPC) by adjusting widths and lengths of one or more of the plurality of polygons, to generate a corrected patterned layout design;
converting the corrected patterned layout design into a mask writer-compatible format, to generate a mask writer-compatible layout design comprising the plurality of polygons; and
biasing each polygon in the plurality of polygons with a bias that accounts for large-scale density values of the patterned layout design, to generate a biased, mask writer-compatible layout design; and
manufacturing the optical photomask in a mask writer tool using the biased, mask writer-compatible layout design as a template for the optical photomask;
disposing the optical photomask over the photoresist layer; and
directing a light source through the photomask so as to expose a portion of the photoresist layer to the light source.

13. The method of claim 12, wherein providing the patterned layout design comprises providing a computer-generated patterned layout design.

14. The method of claim 12, wherein correcting the pattern layout design using OPC comprises accounting for proximity effect errors.

15. The method of claim 14, wherein accounting for proximity effect errors comprises accounting for errors introduced within a few microns of a respective polygon of the plurality of polygons.

16. The method of claim 12, wherein converting the corrected patterned layout design into a mask writer-compatible format comprises accounting for mask writer electron beam process variations.

17. The method of claim 12, wherein biasing each polygon in the plurality of polygons is performed coterminously with converting the corrected patterned layout design into a mask writer-compatible format.

18. The method of claim 12, wherein the optical photomask is designed to form the pre-pattern opening using extreme ultraviolet (EUV) light.

19. The method of claim 18, wherein biasing each polygon in the plurality of polygons comprises compensating for EUV flare.

20. A method of manufacturing an optical lithography mask, the method comprising the steps of:
designing an optical photomask for forming a pre-pattern opening in a photoresist layer on a semiconductor substrate, wherein the step of designing the optical photomask comprises:
providing a patterned layout design comprising a plurality of polygons that correspond with the pre-pattern opening; and
converting the patterned layout design into a mask writer tool-compatible format, to generate a mask writer-compatible layout design comprising the plurality of polygons; and
manufacturing the optical photomask in a mask writer tool using the mask writer tool-compatible layout design as a template for the optical photomask, wherein the step of manufacturing the optical photomask comprises correcting for flare by altering an intensity of the mask writer tool during a mask write process to one or more polygon images of the plurality of polygons.

* * * * *